United States Patent
Louh

(10) Patent No.: US 7,608,387 B1
(45) Date of Patent: Oct. 27, 2009

(54) METHOD FOR FABRICATING MOLD CORE

(75) Inventor: Sei-Ping Louh, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/354,096

(22) Filed: Jan. 15, 2009

(30) Foreign Application Priority Data

May 6, 2008 (CN) .......................... 2008 1 0301440

(51) Int. Cl.
*G03C 5/00* (2006.01)
(52) U.S. Cl. ................. 430/296; 430/297; 430/323; 430/330; 430/942; 430/945
(58) Field of Classification Search ................. 430/296, 430/297, 323, 330, 942, 945
See application file for complete search history.

(56) References Cited

U.S. PATENT DOCUMENTS

| | | | |
|---|---|---|---|
| 2004/0146807 A1* | 7/2004 | Lee et al. | 430/311 |
| 2005/0031998 A1* | 2/2005 | Chen et al. | 430/320 |
| 2005/0037290 A1* | 2/2005 | Chen | 430/320 |

\* cited by examiner

*Primary Examiner*—Christopher G Young
(74) *Attorney, Agent, or Firm*—Clifford O. Chi

(57) ABSTRACT

An exemplary method for fabricating a mold core includes the following steps. First, a substrate is provided. Second, a photo resist layer is formed on the substrate, the photo resist layer has a top surface. Third, the photo resist layer is etched using a direct writing process to form the top surface thereof into a substantially aspherical stepped surface. Lastly, the photo resist layer is softened using a reflow process to transform the substantially aspherical stepped surface into a substantially aspherical smooth molding surface. Thereby, a mold core having the substantially aspherical smooth molding surface is obtained.

16 Claims, 9 Drawing Sheets

METHOD FOR FABRICATING MOLD CORE

BACKGROUND

1. Technical Field

The present invention relates to methods for fabricating mold cores, and particularly, to a method for fabricating a mold core having an aspherical surface.

2. Discussion of Related Art

A typical method for making a mold core includes the following steps: forming a photo resist on a substrate; exposing the photo resist under a light and developing the photo resist; etching the substrate to form a pattern and removing the photo resist; electroforming a body on the substrate; and removing the substrate from the electroformed body to obtain the mold core.

However, the method is complex and time-consuming. Thus, the efficiency of the process is accordingly lowered.

Therefore, a new method for fabricating a mold core is desired to overcome the above mentioned problems.

BRIEF DESCRIPTION OF THE DRAWINGS

Many aspects of the present method for fabricating a mold core can be better understood with reference to the following drawings. The components in the drawings are not necessarily to scale, the emphasis instead being placed upon clearly illustrating the principles of the present method for fabricating a mold core. Moreover, in the drawings, like reference numerals designate corresponding parts throughout the several views.

DETAILED DESCRIPTION OF EMBODIMENTS

Figure 1:
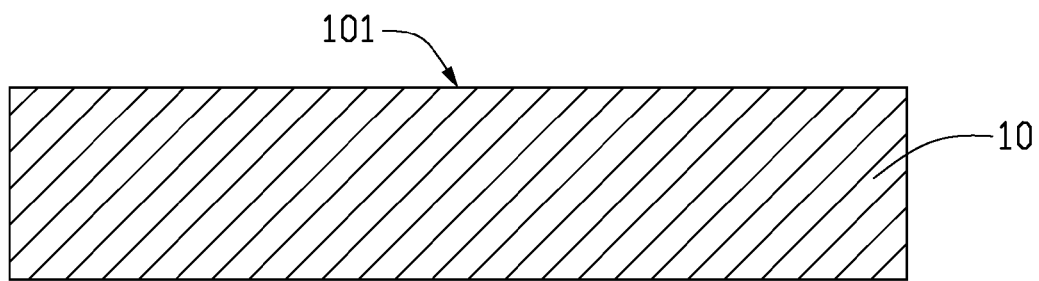
FIGS. 1 to 4 are schematic, sectional views of successive stages of a method for fabricating a mold core, according to an exemplary embodiment.

Reference will now be made to the drawings to describe in detail of the exemplary embodiment of the method for fabricating a mold core.

Referring to FIGS. 1 to 5, a method for fabricating a mold core 100 (referring to FIG. 4) is provided herein according to an exemplary embodiment. The method for fabricating the mold core 100 generally includes the steps of:

providing a substrate 10;

forming a photo resist layer 20 on the substrate 10, the photo resist layer 20 having a top surface 201;

etching the photo resist layer 20 using a direct writing process to form the top surface 201 thereof into a substantially aspherical stepped surface 203 (see FIG. 5); and softening the photo resist layer 20 using a reflow process to transform the substantially aspherical stepped surface 203 into a substantially aspherical smooth molding surface 205, thereby obtaining a mold core 100 having the substantially aspherical smooth molding surface 205.

In detail, referring to FIG. 1, the substrate 10 having a surface 101 is provided. The substrate 10 is comprised of a material selected from a group consisting of plastic, silicon carbide (SiC), tungsten carbide (WC) or quartz glass. The material also can be a metal, such as iron, copper or other lighttight materials. In the present embodiment, the substrate 10 is made of quartz glass.

Figure 2:
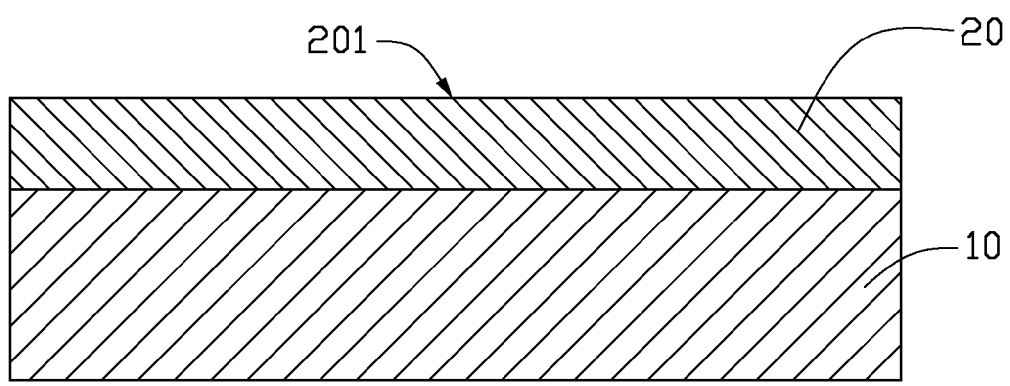

Referring to FIG. 2, a photo resist layer 20 is formed onto the surface 101 of the substrate 10. The photo resist layer 20 may be made of epoxy resin, acrylic resin, polymethyl methacrylate, or polysilicone resin. In the present embodiment, the photo resist 20 is polymethyl methacrylate. It is known that various methods for forming the photo resist layer on a substrate could be applied, such as spin coating, droplet dispensing, and spray coating. The thickness of the photo resist layer 20 may vary according to need.

Figure 3:
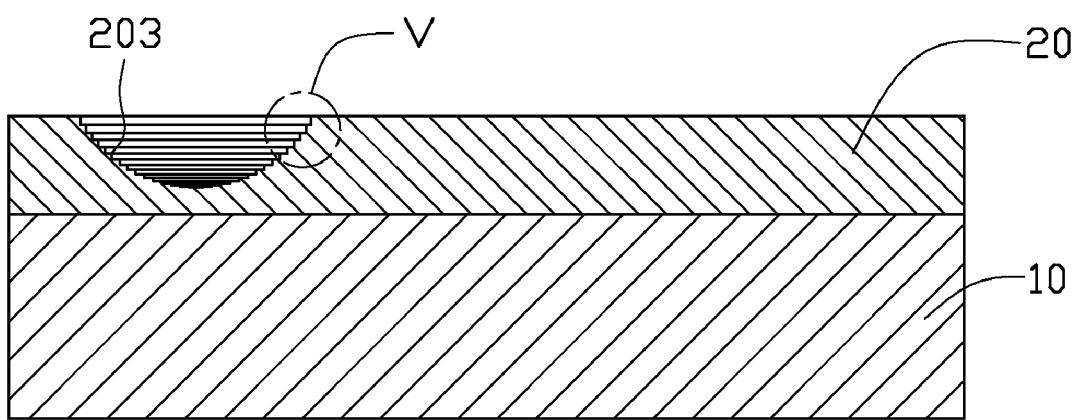
Figure 4:
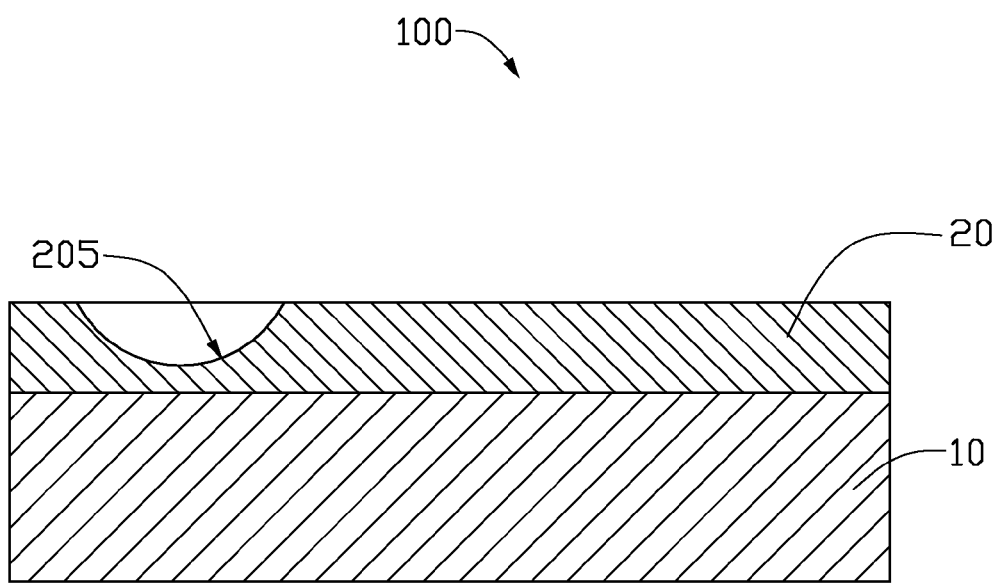
Figure 5:
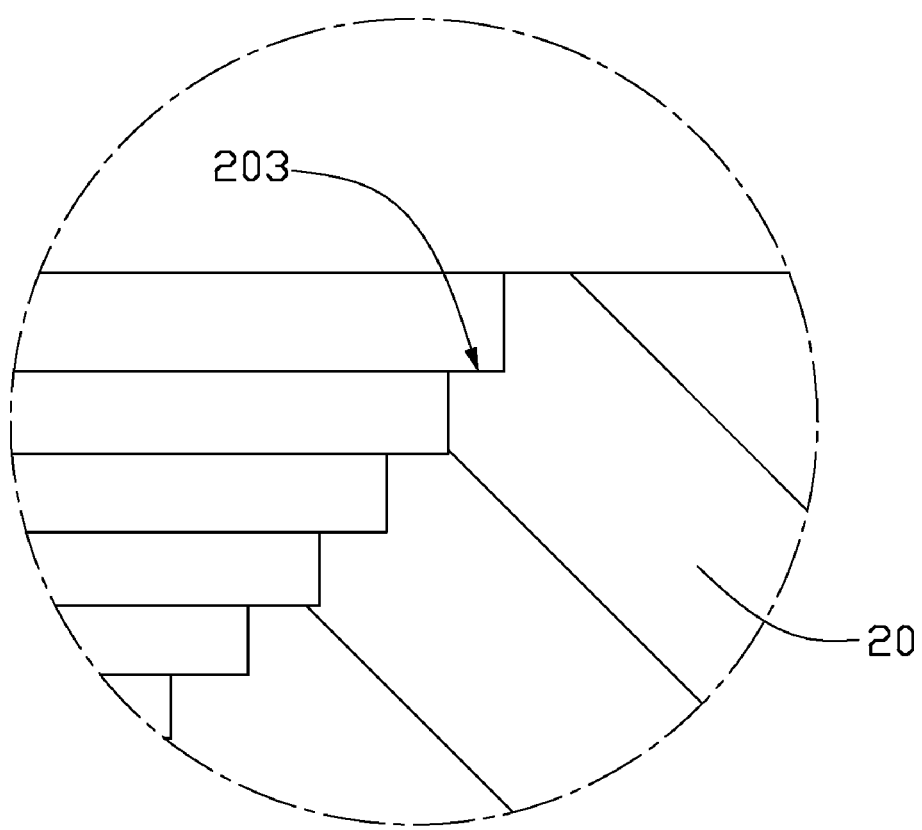
FIG. 5 is a schematic, enlarged view of a circled portion V of FIG. 3.

Referring to FIG. 3, the photo resist layer 20 is etched by using a direct writing process to form the top surface 201 thereof into a substantially aspherical stepped surface 203. The direct writing process may be a laser direct writing process or an electron-beam direct writing process. The substantial aspherical stepped surface 203 has an aspherical profile in the rough.

Figure 6:
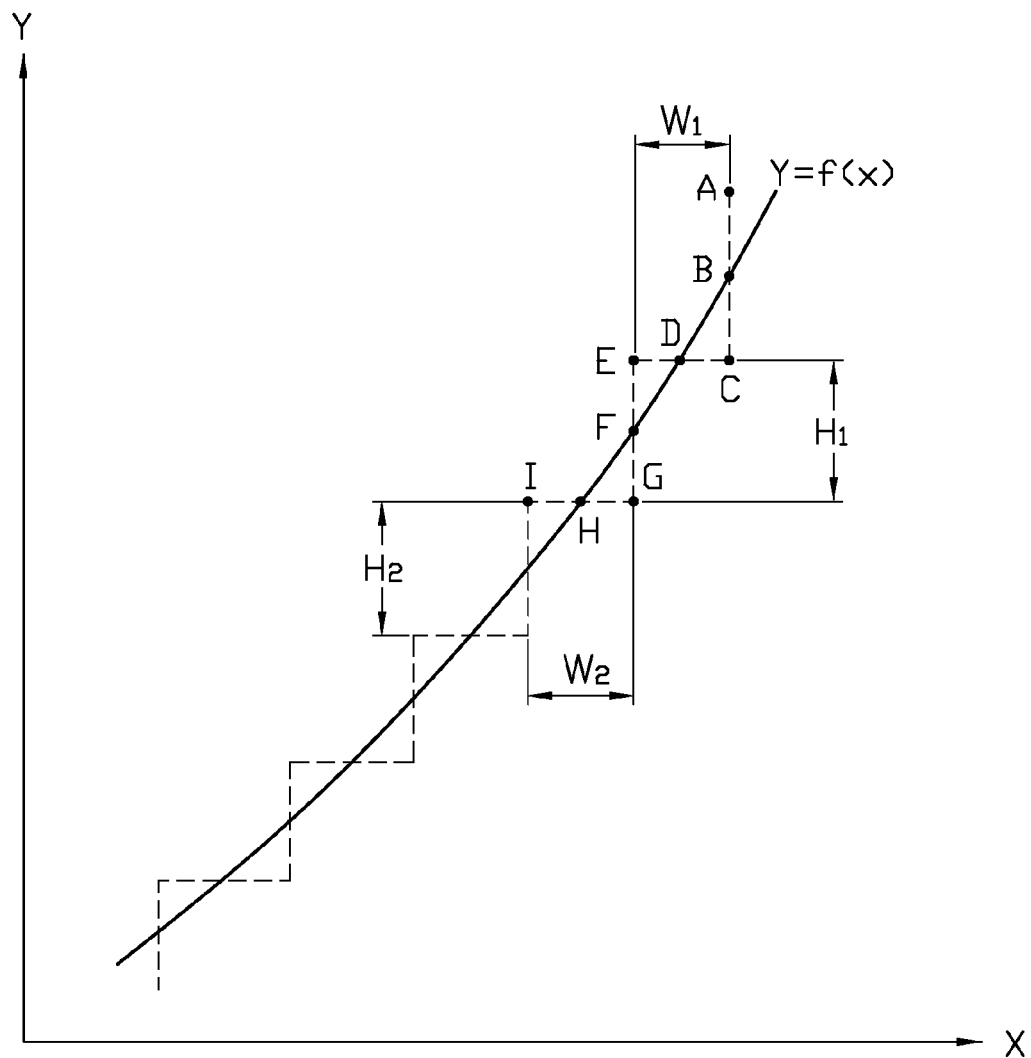
FIG. 6 is a schematic drawing for showing the calculating principle of the height and the width for forming the substantially aspherical stepped surface by direct writing step of the method for fabricating a mold core.

Referring to FIG. 6, a profile of the aspheical smooth molding surface 205 is represented by the following equation:

$$y = f(x) = \frac{cx^2}{1+\sqrt{1-(1+k)c^2x^2}} + a_4x^4 + a_6x^6 + a_8x^8 + \ldots + a_nx^n,$$

x represents an X coordinate of each point on the aspherical surface, y represents a Y coordinate of each point on the aspherical surface, $a_4$, $a_6$, $a_8$, $a_n$ represent coefficients of higher orders of the equation, c represents the curvature at the vertex of the profile, k represents the conic constant, n represents a positive integer and tends to infinity.

A profile of the substantially aspherical stepped surface 203 includes a plurality of contiguous steps, referring to FIG. 6. Each step has a vertical line parallel with the Y axis direction and a horizontal line parallel with the X axis direction. The vertical line and the horizontal line intersect at an outward intersecting point, such as the point "A", the point "E" or the point "I". Each step adjoins two proximate neighboring steps at a first and a second inward intersecting points, such as the point "C" and the point "G".

The width $W_n$ and the height $H_n$ of each step of the substantially aspherical stepped surface 203 may be determined by the following steps.

Firstly, an outward intersecting point, such as the point "E", is determined of a given step, the outward intersecting point "E" is not on the aspherical surface 205.

Secondly, a first inward intersecting point "C" of the given step is determined, the first inward intersecting point "C" has a same Y coordinate as the outward intersecting point "E" and is at an opposite side of the aspherical surface to the outward intersecting point "E", a point "D" on the aspherical surface with the same Y coordinate as the outward intersecting point "E" is equidistant from the outward intersecting point "E" and the first inward intersecting point "C', thereby the width $W_1$ of the given step is obtained which is equal to a distance between the outward intersecting point "E" and the first inward intersecting point "C".

Thirdly, a second inward intersecting point "G" of the given step is determined, the second inward intersecting point "G" has a same X coordinate as the outward intersecting point "E" and is at an opposite side of the aspherical surface to the outward intersecting point "E", a point "F" on the aspherical surface with the same X coordinate as the outward intersecting point "E" is equidistant from the outward intersecting point "E" and the second inward intersecting point "G", thereby the height $H_1$ of the given step is obtained which is equal to a distance between the outward intersecting point "E" and the second inward intersecting point "G".

The width $W_n$ and the height $H_n$ of each step of the substantially aspherical stepped surface 203 also can be determined by the following steps.

Firstly, a first inward intersecting point, such as the point "C", of a given step is determined, the first inward intersecting point "C" is not on the aspherical surface.

Secondly, an outward intersecting point "E" of the given step is determined, the outward intersecting point "E" has a same Y coordinate as the first inward intersecting point "C" and is at an opposite side of the aspherical surface to the first inward intersecting point "C", a point "D" on the aspherical surface with the same Y coordinate as the first inward intersecting point "C" is equidistant from the first inward intersecting point "C" and the outward intersecting point "E", thereby the width $W_1$ of the given step is obtained which is equal to a distance between the outward intersecting point "E" and the first inward intersecting point "C".

Thirdly, a second inward intersecting point "G" of the given step is determined, the second inward intersecting point "G" has a same X coordinate as the outward intersecting point "E" and is at an opposite side of the aspherical surface to the outward intersecting point "E", a point "F" on the aspherical surface with the same X coordinate as the outward intersecting point "E" is equidistant from the outward intersecting point "E" and the second inward intersecting point "G", thereby the height $H_1$ of the given step is obtained which is equal to a distance between the outward intersecting point "E" and the second inward intersecting point "G".

The width $W_n$ and the height $H_n$ of each step of the substantially aspherical stepped surface 203 still can be determined by the following steps.

Firstly, a second inward intersecting point, such as the point "G", of a given step is determined, the second inward intersecting point "G" is not on the aspherical surface.

Secondly, an outward intersecting point "E" of the given step is determined, the outward intersecting point "E" has a same X coordinate as the second inward intersecting point "G" and is at an opposite side of the aspherical surface to the second inward intersecting point "G", a point "F" on the aspherical surface with the same X coordinate as the second inward intersecting point "G" is equidistant from the second inward intersecting point "G" and the outward intersecting point "E", thereby the height $H_1$ of the given step is obtained which is equal to a distance between the outward intersecting point "E" and the second inward intersecting point "G".

Thirdly, a first inward intersecting point "C" of the given step is determined, the first inward intersecting point "C" has a same Y coordinate as the outward intersecting point "E" and is at an opposite side of the aspherical surface to the outward intersecting point "E", a point "D" on the aspherical surface with the same Y coordinate as the outward intersecting point "E" is equidistant from the outward intersecting point "E" and the first inward intersecting point "C", thereby the width $W_1$ of the given step is obtained which is equal to a distance between the outward intersecting point "E" and the first inward intersecting point "C".

By following any one of the above three kinds of steps, the height and the width of each step can be obtained.

In the present embodiment, the direct writing process is a laser direct writing process. The height of each step, such as $H_1$, $H_2$, is controlled by controlling the light intensity of a laser beam. The width of each step, such as $W_1$, $W_2$, is controlled by the scan area of the laser beam. Therefore, the laser direct writer can be set according to the preestablished parameters to obtain the substantially aspherical stepped surface 203.

Figure 7:
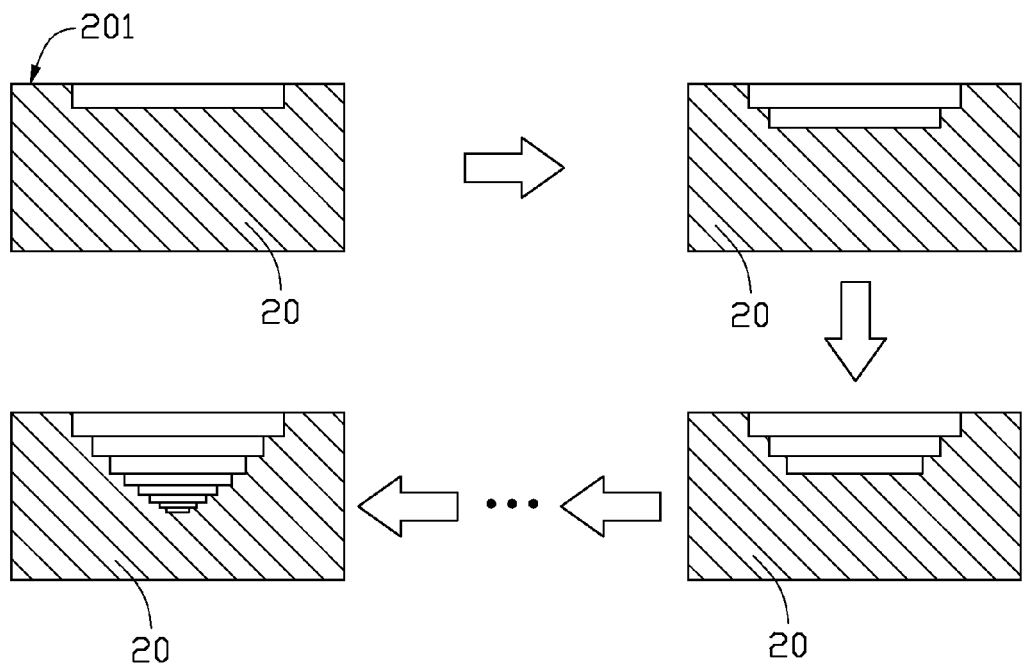
FIGS. 7 to 8 are schematic drawings showing the sequence of the etching for forming the substantially aspherical stepped surface by direct writing step of the method for fabricating a mold core.
Figure 8:
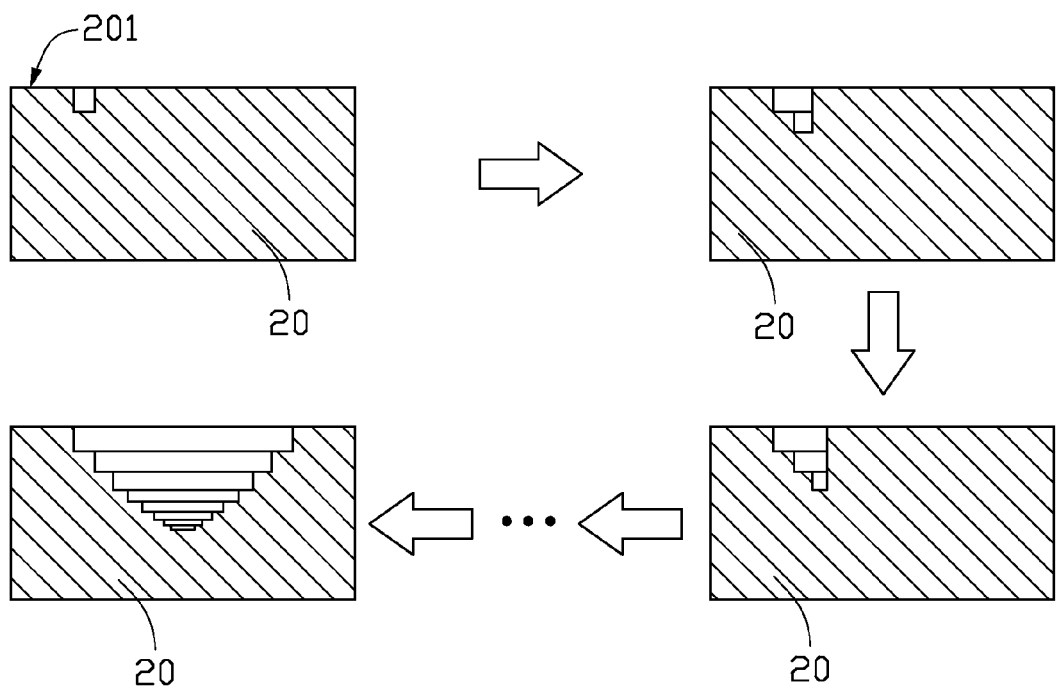
Figure 9:
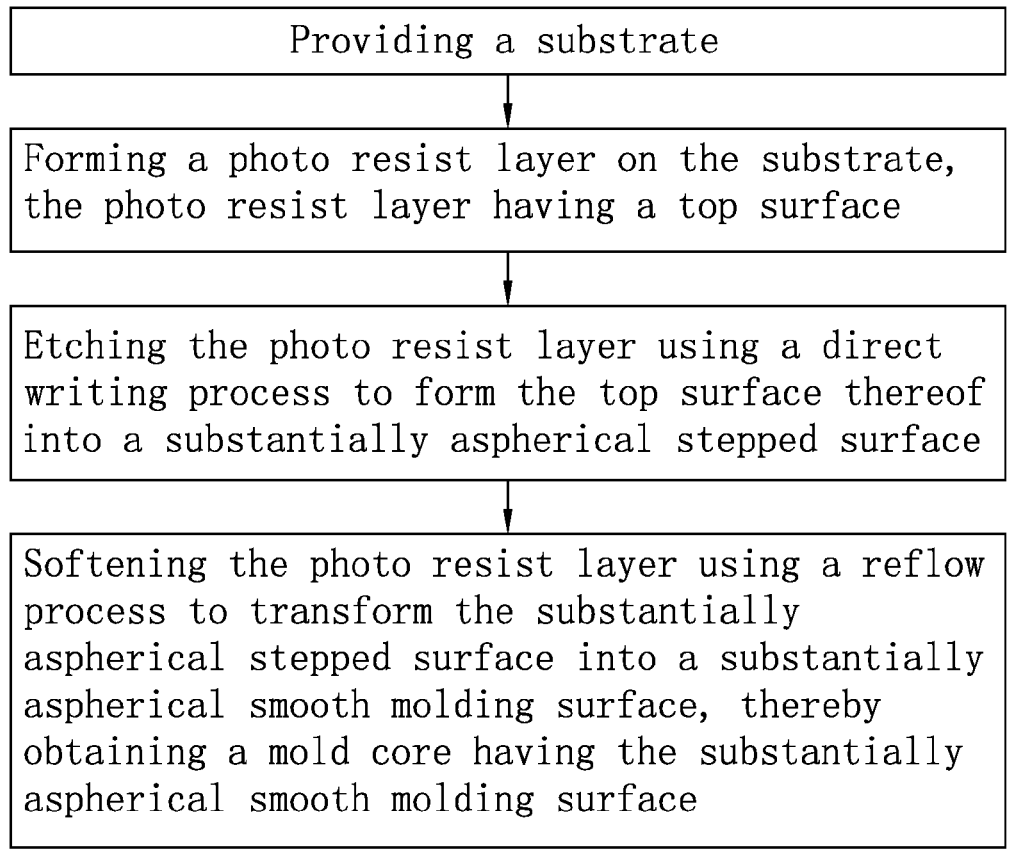
FIG. 9 is a flow chart of a method for fabricating a molding core, according to an exemplary embodiment.

The light intensity and the scan area of the laser beam of the laser direct writer can be precisely controlled, therefore the height and the width of each step of the etching can be precisely controlled by preestablished parameters, such that, before performing the etching, firstly, the parameters of the width and the height of each step should be calculated. Secondly, the direct writer is set by these parameters and then each step on the photo resist layer 20 is etched to form the substantially aspherical stepped surface 203. Referring to FIG. 3, the substantially aspherical stepped surface 203 looks like a substantially aspheric surface but not smooth. When etching, the photo resist layer 20 may be progressively etched by scanning the photo resist layer 20 using the laser beam along a direction parallel to the X coordinate axis. For example, the photo resist layer 20 may be progressively etched by progressively reducing the scan area of the laser beam (see FIG. 7), or the photo resist layer 20 may be progressively etched by progressively increasing the light intensity of the laser beam (see FIG. 8).

The direct writing process also can be an electron-beam direct writing process. The height of each step is controlled by controlling the intensity of an electron beam, and the width of each step is controlled by the scan area of the electron beam. When etching, the photo resist layer 20 may be progressively etched by scanning the photo resist layer using the electron beam along a direction parallel to the X coordinate axis. For example, the photo resist layer 20 may be progressively etched by progressively reducing the scan area of the electron beam.

The photo resist layer 20 is softened by using a reflow process to transform the substantially aspherical stepped surface 203 into a substantially aspherical smooth molding surface 205. Thereby a mold core 100 having the substantially aspherical smooth molding surface 205 is obtained, referring to FIG. 4. The substrate 10 with the photo resist layer 20 is then positioned on a general resistance heating type thermal plate to heat the photo resist layer 20. When heating temperature is close to melting point, the photo resist layer 20 will intenerate and flow. By reflow theory, the reflow have the tendency to flow to the middle. Accurately controlling the variety of the temperature can make the substantially aspherical stepped surface 203 to form a smooth surface, to achieve a substantially aspherical smooth molding surface 205 on the mold core 100.

After the softening step, the method for fabricating the mold core 100 further includes a step of hard baking the photo resist layer 20 and the substance 10. The hard baking step can be operated by hot air convection of bake box, infrared radiation or thermal backing plate. In this embodiment, the hard baking step is operated by hot air convection of bake box. The hard baking temperature is 185 to 200 centigrade, and the baking time is 15 to 20 minutes long. After hard baking, the mold core 100 is formed.

It should be noted that whether to carry on the steps of hard baking could be decided according to an actual need. If a hard baking step is needed, the hard baking temperature and the hard baking time should also be decided according to an actual need.

While the present invention has been described as having preferred or exemplary embodiments, the embodiments can be further modified within the spirit and scope of this disclosure. This application is therefore intended to cover any variations, uses, or adaptations of the embodiments using the general principles of the invention as claimed. Further, this application is intended to cover such departures from the present disclosure as come within known or customary practice in the art to which the invention pertains and which fall within the limits of the appended claims or equivalents thereof.

What is claimed is:

1. A method for fabricating a mold core comprising:
providing a substrate;
forming a photo resist layer on the substrate, the photo resist layer having a top surface;
etching the photo resist layer using a direct writing process to form the top surface thereof into a substantially aspherical stepped surface; and
softening the photo resist layer using a reflow process to transform the substantially aspherical stepped surface into a substantially aspherical smooth molding surface, thereby obtaining a mold core having the substantially aspherical smooth molding surface.

2. The method of claim 1, wherein a profile of the aspheical smooth molding surface is represented by the following equation:

$$y = f(x) = \frac{cx^2}{1 + \sqrt{1-(1+k)c^2 x^2}} + a_4 x^4 + a_6 x^6 + a_8 x^8 + \ldots + a_n x^n,$$

x represents an X coordinate of each point on the aspherical surface, y represents a Y coordinate of each point on the aspherical surface, $a_4$, $a_6$, $a_8$, $a_n$ represent coefficients of higher orders of the equation, c represents the curvature at the vertex of the profile, k represents the conic constant, n represents a positive integer and tends to infinity.

3. The method of claim 2, wherein a profile of the substantially aspherical stepped surface comprises a plurality of contiguous steps, each step having a vertical line parallel with the Y axis direction and a horizontal line parallel with the X axis direction, the vertical line and the horizontal line intersecting at an outward intersecting point, each step adjoining two proximate neighboring steps at a first and a second inward intersecting points, and the width and the height of each step of the substantially aspherical stepped surface are determined by the following steps:
determining an outward intersecting point of a given step, the outward intersecting point being not on the aspherical surface;
determining a first inward intersecting point of the given step, the first inward intersecting point having a same Y coordinate as the outward intersecting point and being at an opposite side of the aspherical surface to the outward intersecting point, a point on the aspherical surface with the same Y coordinate as the outward intersecting point being equidistant from the outward intersecting point and the first inward intersecting point, thereby obtaining the width of the given step which is equal to a distance between the outward intersecting point and the first inward intersecting point; and
determining a second inward intersecting point of the given step, the second inward intersecting point having a same X coordinate as the outward intersecting point and being at an opposite side of the aspherical surface to the outward intersecting point, a point on the aspherical surface with the same X coordinate as the outward intersecting point being equidistant from the outward intersecting point and the second inward intersecting point, thereby obtaining the height of the given step which is equal to a distance between the outward intersecting point and the second inward intersecting point.

4. The method of claim 2, wherein a profile of the substantially aspherical stepped surface comprises a plurality of contiguous steps, each step having a vertical line parallel with the Y axis direction and a horizontal line parallel with the X axis direction, the vertical line and the horizontal line intersecting at an outward intersecting point, each step adjoining two proximate neighboring steps at a first and a second inward intersecting points, and the width and the height of each step of the substantially aspherical stepped surface are determined by the following steps:
determining a first inward intersecting point of a given step, the first inward intersecting point being not on the aspherical surface;
determining an outward intersecting point of the given step, the outward intersecting point having a same Y coordinate as the first inward intersecting point and being at an opposite side of the aspherical surface to the first inward intersecting point, a point on the aspherical surface with the same Y coordinate as the first inward intersecting point being equidistant from the first inward intersecting point and the outward intersecting point, thereby obtaining the width of the given step which is equal to a distance between the outward intersecting point and the first inward intersecting point; and
determining a second inward intersecting point of the given step, the second inward intersecting point having a same X coordinate as the outward intersecting point and being at an opposite side of the aspherical surface to the outward intersecting point, a point on the aspherical surface with the same X coordinate as the outward intersecting point being equidistant from the outward intersecting point and the second inward intersecting point, thereby obtaining the height of the given step which is equal to a distance between the outward intersecting point and the second inward intersecting point.

5. The method of claim 2, wherein a profile of the substantially aspherical stepped surface includes a plurality of contiguous steps, each step having a vertical line parallel with the Y axis direction and a horizontal line parallel with the X axis direction, the vertical line and the horizontal line intersecting at an outward intersecting point, each step adjoining two proximate neighboring steps at a first and a second inward intersecting point, and the width and the height of each step of the substantially aspherical stepped surface is determined by the following steps:
determining a second inward intersecting point of a given step, the second inward intersecting point being not on the aspherical surface;
determining an outward intersecting point of the given step, the outward intersecting point having a same X coordinate as the second inward intersecting point and being at an opposite side of the aspherical surface to the second inward intersecting point, a point on the aspherical surface with the same X coordinate as the second inward intersecting point being equidistant from the second inward intersecting point and the outward intersecting point, thereby obtaining the height of the given step which is equal to a distance between the outward intersecting point and the second inward intersecting point; and determining a first inward intersecting point of the given step, the first inward intersecting point having a same Y coordinate as the outward intersecting point and being at an opposite side of the aspherical surface to the outward intersecting point, a point on the aspherical surface with the same Y coordinate as the outward intersecting point being equidistant from the outward intersecting point and the first inward intersecting point, thereby obtaining the width of the given step which is equal to a distance between the outward intersecting point and the first inward intersecting point.

6. The method of claim 1, wherein the direct writing process is a laser direct writing process.

7. The method of claim 6, wherein the height of each step is controlled by controlling the light intensity of a laser beam, and the width of each step is controlled by the scan area of the laser beam.

8. The method of claim 7, wherein the photo resist layer is progressively etched by scanning the photo resist layer using the laser beam along a direction parallel to the X coordinate axis.

9. The method of claim 7, wherein the photo resist layer is progressively etched by progressively reducing the scan area of the laser beam.

10. The method of claim 1, wherein the substrate is comprised of a material selected from a group consisting of plastic, silicon carbide, tungsten carbide, quartz glass and metal.

11. The method of claim 1, wherein the photo resist layer is formed by a method selected from the group consisting of spin coating, droplet dispensing and spray coating.

12. The method of claim 1, wherein the direct writing process is an electron-beam direct writing process.

13. The method of claim 12, wherein the height of each step is controlled by controlling the intensity of an electron beam, and the width of each step is controlled by the scan area of the electron beam.

14. The method of claim 13, wherein the photo resist layer is progressively etched by scanning the photo resist layer using the electron beam along a direction parallel to the X coordinate axis.

15. The method of claim 13, wherein the photo resist layer is progressively etched by progressively reducing the scan area of the electron beam.

16. The method of claim 1, further comprising hard baking the photo resist layer after the softening step.

* * * * *